(12) United States Patent
Geist et al.

(10) Patent No.: US 7,120,568 B1
(45) Date of Patent: Oct. 10, 2006

(54) IDENTIFICATION OF MISSING PROPERTIES IN MODEL CHECKING

(75) Inventors: Daniel Geist, Haifa (IL); Orna Grumberg, Haifa (IL); Sagi Katz, Binyamina (IL)

(73) Assignee: Marvell Semiconductor Israel Ltd., Karmiel (IL)

( * ) Notice: Subject to any disclaimer, the term of this patent is extended or adjusted under 35 U.S.C. 154(b) by 1140 days.

(21) Appl. No.: 09/605,334

(22) Filed: Jun. 27, 2000

(30) Foreign Application Priority Data

Sep. 23, 1999 (IL) ..................................... 132058

(51) Int. Cl.
G06F 17/50 (2006.01)
G06F 9/44 (2006.01)
(52) U.S. Cl. .......................................... 703/13; 703/20
(58) Field of Classification Search .................. 703/13, 703/20
See application file for complete search history.

(56) References Cited

U.S. PATENT DOCUMENTS 5,600,579 A * 2/1997 Steinmetz, Jr. .............. 703/13
6,385,765 B1 * 5/2002 Cleaveland et al. ........ 717/100

OTHER PUBLICATIONS

Clarke, E. Jr. et al., "Model Checking" Chapter 1, MIT Press, 1999, pp. 4-6.*
McMillian-K "Symbolic Model Checking" Kluwer Academic Publishers, Chapter 2, p. 2 and p. 11-12, 1993. Norwell, Mass.*
Grumberg-O et al. "Model Checking and Modular Verification" ACM Transactions on Programming Languages and Systems, vol. 16, No. 3, May 1994, pp. 843-871.*
Clarke-E et al. "Verification of the Futurebus +Cashe Coherence Protocol", Proceedings of the 11th International Conference on Computer Hardware Description Languages, Oct. 1992, pp. 1-14.*
Manna-Z et al., "Temporal Verification of Reactive Systems—Safety" Springer-Verlag, 1995, Chapter 5, pp. 451-455.*
Beer-I et al. "RuleBase: Model Checking at IBM" Computer-Aided Verification Conference, Haifa, Jul. 1997, pp. 1-4.*
Katx-S et al., "Have I Written Enough Properties?—Method of Comparison Between Specification and Implementation", Charone Conference, Bad Hevrenalle, Germany, Dec. 27, 1998,pp. 1-14.*
Hoskote-Y et al. "Coverage Estimation for Symbolic Modeling Checking" Proceedings of the Design Automation Conference DAC'99 (IEEE Computer Society Press, 1999), pp. 300-305.*
Beer-I et al. "RuleBase: An Industry-Oriented Formal Verification Tool", Design Automation Conference DAC '96, Las Vegas, Jun. 1996, pp. 1-6.*
Cleveland.R ("Tableau-base Model Checking in the Proportional Mu-Calculus" (1990) N.C. State University. p. 1-25.*

(Continued)

*Primary Examiner*—Paul L. Rodriguez
*Assistant Examiner*—Tom Stevens
(74) *Attorney, Agent, or Firm*—Darby & Darby (57) ABSTRACT

A method for verification includes providing an implementation model, which defines model states of a target system and model transitions between the model states, and providing a specification of the target system, including properties that the system is expected to obey. A tableau is created from the specification, the tableau defining tableau states with tableau transitions between the tableau states in accordance with the properties. The tableau transitions are compared to the model transitions to determine whether a discrepancy exists therebetween.

32 Claims, 5 Drawing Sheets

OTHER PUBLICATIONS

Cleveland et al., "The Concurrency Factory—Practical Tools for Specification, Simulation, Verication, and Implementation of Concurrent Systems" May 1994 Preceedings of DIMACS Workshop on Specification of Parallel Algorithms. p. 1-15.*

Orna Grumber's Publciations: 1998 Google Search p. 1-17.*

Geist et al., "Efficient Model Checking by Autmated Ordering of Transistion Relation Patitions" 1994 p. 299-310.*

Katz, S. et al., "Have I Written Enough Properties?—Method of Comparison Between Specification and Implementation", Charone Conference, Bad Hevrenalle, Germany, Dec. 27, 1998, pp. 1-14.

Hoskote, Y. et al., "Coverage Estimation for Symbolic Model Checking", *Proceedings of the Design Automation Conference DAC '99* (IEEE Computer Society Press, 1999), pp. 300-305.

Beer, I. et al., "RuleBase: an Industry-Oriented Formal Verification Tool", *Design Automation Conference DAC '96*, Las Vegas, Jun. 1996, pp. 1-6.

Clark, E. Jr. et al., Model Checking, Chapter 1, MIT Press 1999, pp. 4-6.

McMillan, K., Symbolic Model Checking, Kluwer Academic Publishers, Chapter 2, p. 2 and p. 11-12, 1993, Norwell, Massachusetts.

Grumberg, O. et al., "Model Checking and Modular Verification", ACM Transactions on Programming Languages and Systems, vol. 16, No. 3, May 1994, pp. 843-871.

Clarke, E. et al., "Verification of the Futurebus+Cache Coherence Protocol", Proceedings of the 11th International Conference on Computer Hardware Description Languages, Oct. 1992, pp. 1-14.

Manna, Z. et al., "Temporal Verification of Reactive Systems—Safety", Springer-Verlag, 1995, Chapter 5, pp. 451-455.

Milner, R., "An Algebraic Definition of Simulation Between Programs", Proceedings of the 2nd International Joint Conference on Artificial Intelligence, Session No. 11, Theoretical Foundations; BCS, pp. 481-489, 1971.

Beer, I. et al., "RuleBase: Model Checking at IBM", Computer Aided Verification Conference, Haifa, Jul. 1997, pp. 1-4.

Katz, S. et al., "Have I written enough Properties+—A Method of Comparison between Specification and Implementation", Proceedings of the 10th IFIP WG 10.5 Advanced Research Working Conference on Correct Hardware Design and Verification Methods, p. 280-297, Sep. 27-29, 1999.

Hoskote, Y. et al. "Coverage Estimation for Symoblic Model Checking", Proceedings of the Design Automation Conference DAC '99 (IEEE Computer Society Press, 1999), pp. 300-305.

Beer, I. et al., RuleBase: an Industry-Oriented Formal Verification Tool:, Design Automation Conference DAC '96, Las Vegas, Jun. 1996, pp. 1-6.

* cited by examiner

IDENTIFICATION OF MISSING PROPERTIES IN MODEL CHECKING

FIELD OF THE INVENTION

The present invention relates generally to design automation and verification, and specifically to hardware verification of integrated circuit design.

BACKGROUND OF THE INVENTION

Hardware verification is currently the bottleneck and the most expensive task in the design of a semiconductor integrated circuit. Model checking is a method of formal verification that is gaining in popularity for this purpose. The method is described generally by Clarke et 1. in *Model Checking* (MIT Press, 1999).

To perform model checking of the design of a device, a verification engineer reads the definition and functional specifications of the device and then, based on this information, writes a set of properties $\{\phi\}$ (also known as a specification) that the design is expected to fulfill. The properties are written in a suitable specification language for expressing temporal logic relationships between the inputs and outputs of the device. Such languages are commonly based on Computation Tree Logic (CTL). A hardware model M (also known as an implementation) of the design, which is typically written in a hardware description language, such as VHDL or Verilog, is then tested to ascertain that the model satisfies all of the properties in the set, i.e., that $M \models \phi$, under all possible input sequences. Such testing is a form of reachability analysis.

Model checking is preferably carried out automatically by a symbolic model checking program, such as SMV, as described, for example, by McMillan in *Symbolic Model Checking* (Kluwer Academic Publishers, 1993). A number of practical model checking tools are available, among them RuleBase, developed by IBM, which is described by Beer et al. in "RuleBase: an Industry-Oriented Form Verification Tool," in *Proceedings of the Design Automation Conference DAC'96* (Las Vegas, Nev., 1996).

As hardware devices grow larger and more complex, the set of properties needed for model checking becomes unwieldy. The verification engineer has no systematic way to be sure of whether the property set is complete, in the sense of covering all possible states and transitions that may occur in the model. If the property set is incomplete, a bug in the design may go undetected. The engineer may therefore continue to add more and more properties indefinitely, never knowing whether the set is yet sufficient or not.

Coverage metrics have been applied in various fields of simulation-based verification in order to measure and improve the completeness with which a given simulation tool represents the actual behavior of a target system. An application of such a metric to model checking is described by Hoskote et al., in "Coverage Estimation for Symbolic Model Checking," in *Proceedings of the Design Automation Conference DAC'99* (IEEE Computer Society Press, 199). This publication presents a method for estimating whether a set of properties is sufficient to cover all possible states of a model. It notes, however, that the disclosed method cannot point out functionality that may be missing in the model, nor can it ensure that all possible paths between the states are covered. The publication also indicates that "path coverage would be an ideal coverage metric because it can provide coverage of actual executions of the circuit over time." The publication considers that by comparison with state coverage, "path coverage is a much more intractable problem."

SUMMARY OF THE INVENTION

It is an object of some aspects of the present invention to provide improved methods and systems for design verification.

It is a further object of some aspects of the present invention to provide improved methods and metrics for analyzing the coverage of a set of properties used in model checking, and in particular to provide methods for analyzing path coverage.

In preferred embodiments of the present invention, a specification, consisting of properties, is generated to verify a given implementation model of a target system, and a tableau is constructed corresponding to the properties. Such a tableau is defined as a finite state machine that satisfies all of the properties in the specification. The states and transitions of the tableau are compared to those of the model to ascertain that there is full correspondence between the possible states and transitions of the model and those of the tableau. To the extent that there are no substantive differences, it is concluded that the set of properties fully specifies the model.

In some preferred embodiments of the present invention, the tableau is compared to the model by inputting the tableau to a model checking program, such as SMV, along with the given model. If for every possible combination of inputs, the tableau gives exactly the same set of outputs as the model, then the specification of the properties is complete. On the other hand, if a difference occurs for some input, it means that the specified properties are insufficient and/or that there is an error in the model. The fact that the outputs of the tableau exactly correspond to those of the model indicates that for every reachable state of the tableau, there is a corresponding state in the model, and for every possible transition in the tableau, there is a corresponding transition between the corresponding states in the model. It also means that there are no excess transitions or spurious initial conditions in the tableau that would allow transitions to be made among states in a way that would not be possible in the model.

The methods of the present invention thus inform the user when the specification of properties is complete or, alternatively, provide an indication as to where there may be flaws in the correspondence between the specification and the model. Such flaws typically point either to a state or transition in the tableau that is not implemented in the model, thus warning either that the specification does not adequately constrain the model, or that the model has failed to implement a meaningful state or transition of the target system. By comparison, the method of Hoskote et al. is limited to finding an estimation of state coverage, and not transitions or exact state coverage, and therefore cannot provide a conclusive indication that the set of properties is complete.

There is therefore provided, in accordance with a preferred embodiment of the present invention, a method for verification, including:

providing an implementation model, which defines model states of a target system and model transitions between the model states;

providing a specification of the target system, including properties that the system is expected to obey;

creating a tableau from the specification, the tableau defining tableau states with tableau transitions between the tableau states in accordance with the properties; and comparing the tableau transitions to the model transitions to determine whether a discrepancy exists therebetween.

In a preferred embodiment, creating the tableau includes defining a finite state machine using a hardware description language, wherein the implementation model has model inputs and outputs, and wherein defining the finite state machine includes describing a virtual device having inputs and outputs corresponding to the model inputs and outputs of the implementation model. Preferably, comparing the transitions includes performing a reachability analysis using both the implementation model and the tableau while providing identical inputs to the inputs of both the implementation model and the tableau, and verifying that the outputs are always identical. Most preferably, performing the reachability analysis includes comparing the model and the tableau automatically using a model checker and providing evidence of a tableau transition that is not implemented in the model.

In another preferred embodiment, comparing the tableau transitions includes associating model transitions with corresponding tableau transitions, wherein associating the transitions includes defining a reachable simulation preorder relating the model and the tableau. Preferably, associating the transitions includes finding a tableau transition that is not implemented in the model and, most preferably, deriving an indication, based on the unimplemented transition, that the specification is not complete with respect to the model. Alternatively or additionally, finding the tableau transition that is not implemented in the model includes deriving an indication, based on the unimplemented transition, that a transition of the target system is missing in the model.

Preferably, the method includes associating model states with corresponding tableau states. Further preferably, associating the model states with the corresponding tableau states includes finding a tableau state that is not implemented in the model and deriving an indication, based on the unimplemented state, that the specification is not complete with respect to the model. Alternatively or additionally, finding the tableau state that is not implemented in the model includes deriving an indication, based on the unimplemented state, that a state of the target system is missing in the model. Further alternatively or additionally, associating the model states with the corresponding tableau states includes finding multiple model states corresponding to a single tableau state.

Preferably, creating the tableau includes creating a reduced tableau from which one or more redundant states have been eliminated.

Further preferably, comparing the transitions includes verifying that the specification is a complete and correct description of the implementation model responsive to the comparison.

There is also provided, in accordance with a preferred embodiment of the present invention, a verification processor, which is configured to receive an implementation model, defining model states of a target system and model transitions between the model states, and to receive a specification of the target system, including properties that the system is expected to obey, and which is operative to create a tableau from the specification, the tableau defining tableau states with tableau transitions between the tableau states in accordance with the properties, and to compare the tableau transitions to the model transitions to determine whether a discrepancy exists therebetween. Preferably, the processor is operative to perform model checking of the implementation model.

There is further provided, in accordance with a preferred embodiment of the present invention, a computer software product for verification of a specification of a target system, which specification includes properties that the system is expected to obey, by comparison with an implementation model, which defines model states of the target system and model transitions between the model states, the product including a computer-readable medium having computer program instructions recorded therein, which instructions, when read by a computer, cause the computer to create a tableau from the specification, the tableau defining tableau states with tableau transitions between the tableau states in accordance with the properties, and to compare the tableau transitions to the model transitions to determine whether a discrepancy exists therebetween.

Preferably, the program instructions cause the computer to compare the tableau with the model by running a reachability analysis using both the implementation model and the tableau while providing identical inputs to the inputs of both the implementation model and the tableau, and verifying that the outputs are always identical. Most preferably, the reachability analysis is performed using an automatic model checker, and the instructions cause the computer to verify that the specification is a complete description of the implementation model.

There is additionally provided, in accordance with a preferred embodiment of the present invention, a method for verification, including:

providing an implementation model, which defines model states of a target system and model transitions between the model states;

providing a specification of the target system, including properties that the system is expected to obey;

creating a tableau from the specification, the tableau defining tableau states with tableau transitions between the tableau states in accordance with the properties; and comparing the model and the tableau by inputting the model and the tableau to an automatic model checking program.

Preferably, comparing the model and the tableau includes providing evidence of a transition or state in the tableau that is not implemented in the model, most preferably in the form of a counter-example indicative of the unimplemented transition or state.

There is moreover provided, in accordance with a preferred embodiment of the present invention, model checking apparatus, which is configured to receive an implementation model, defining model states of a target system and model transitions between the model states, and to receive a specification of the target system, including properties that the system is expected to obey, and which is operative to create a tableau from the specification, the tableau defining tableau states with tableau transitions between the tableau states in accordance with the properties, and to compare the tableau to the model by inputting the model and the tableau to an automatic model checking program.

There is furthermore provided, in accordance with a preferred embodiment of the present invention, a computer software product for verification of a specification of a target system, which specification includes properties that the system is expected to obey, by comparison with an implementation model, which defines model states of the target system and model transitions between the model states, the product including a computer-readable medium having computer program instructions recorded therein, which instructions, when read by a computer, cause the computer to create a tableau from the specification, the tableau defining tableau states with tableau transitions between the tableau states in accordance with the properties, and to compare the tableau to the model by inputting the model and the tableau to an automatic model checking program.

The present invention will be more fully understood from the following detailed description of the preferred embodiments thereof, taken together with the drawings in which:

DETAILED DESCRIPTION OF PREFERRED EMBODIMENTS

Figure 1:
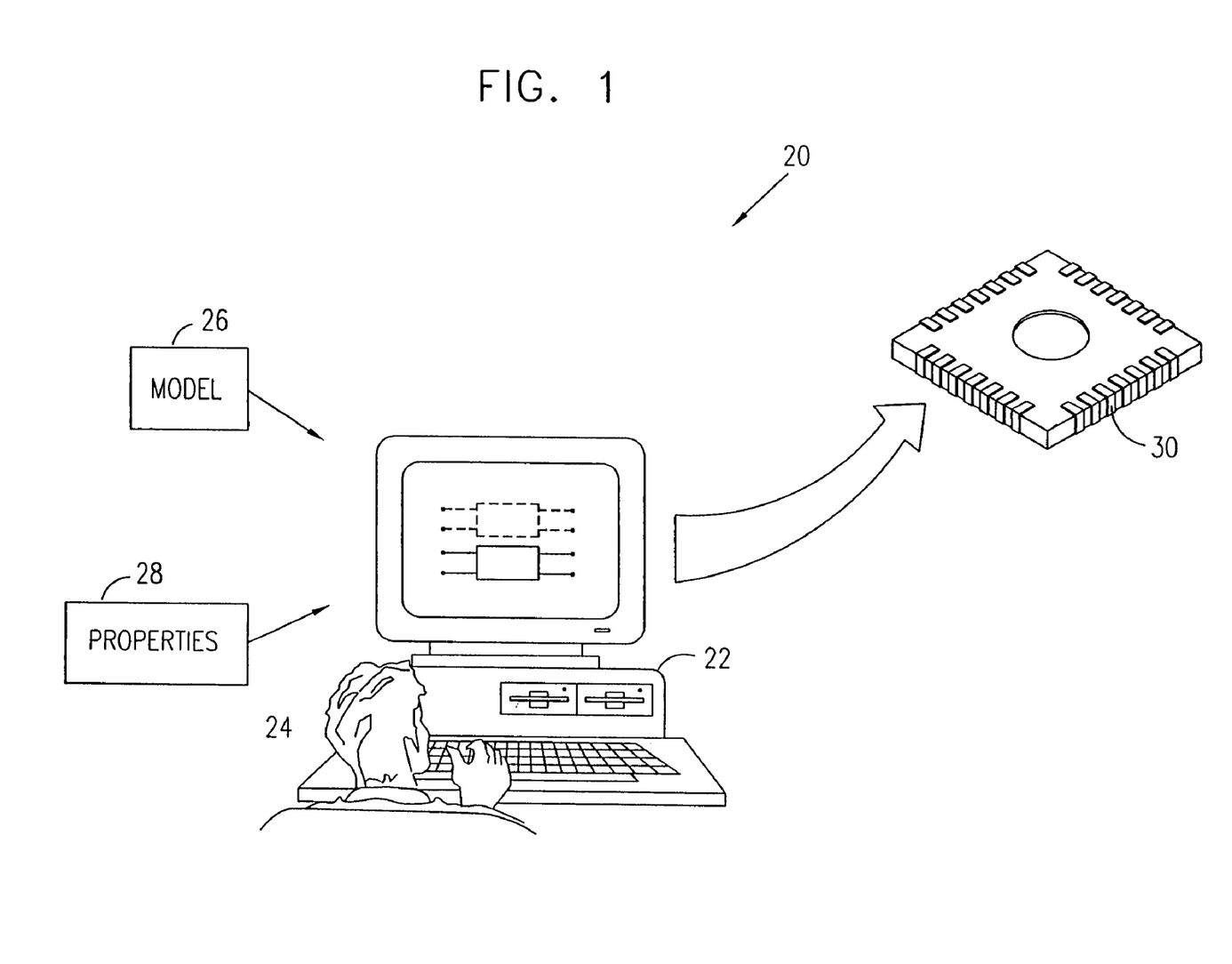
FIG. 1 is a schematic pictorial illustration showing a system for model checking, in accordance with a preferred embodiment of the present invention.

FIG. 1 is a schematic pictorial illustration of a system 20 for model checking, in accordance with a preferred embodiment of the present invention. System 20 typically comprises a verification processor 22, typically a general-purpose computer workstation running suitable model checking software, such as the above-mentioned IBM RuleBase, under the control of a verification engineer 24. The system receives a hardware implementation model 26 of a target system or device 30 in development. Engineer 24 prepares a specification of properties 28, for use in model checking of model 26. The completeness and correctness of the specification are verified by system 20 using methods described in detail hereinbelow.

Figure 2:
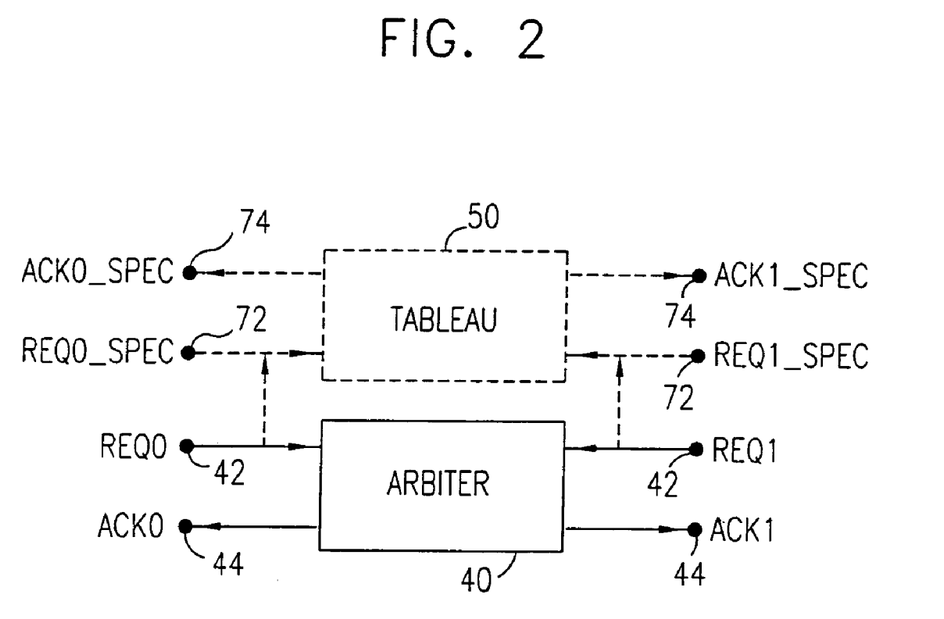
FIG. 2 is a block diagram that schematically illustrates an implementation model used in model checking and a corresponding tableau of properties, in accordance with a preferred embodiment of the present invention.

Reference is now made to FIG. 2, which is a block diagram representing a model of a target hardware device 40, in this case a simple two-port synchronous arbiter, used hereinbelow to exemplify a method for verifying property set 28, in accordance with a preferred embodiment of the present invention. Device 40 has two request inputs 42, labeled REQ0 and REQ1, and two acknowledge outputs 44, ACK0 and ACK1. The assertion of ACKi is a response to the assertion of REQi. Initially, both outputs of the arbiter are inactive. At any time, at most one acknowledge output may be active. The arbiter grants one of the active requests in the next cycle, and uses a round robin algorithm in case both request inputs are active. In the case of simultaneous assertion (i.e. both requests are asserted and were not asserted in the previous cycle), REQ0 has priority in the first simultaneous assertion occurrence. In any subsequent occurrence of simultaneous assertion the priority rotates with respect to the previous occurrence.

An implementation of device 40 in the SMV language is presented below in Table I:

TABLE I

| | | | | |
|---|---|---|---|---|
| 1) | var | | | |
| 1) | | req0; req1; ack0; ack1; robin : boolean; | | |
| 3) | assign | | | |
| 4) | | init(ack0) := 0; | | |
| 5) | | init(ack1) := 0; | | |
| 6) | | init(robin) := 0; | | |
| 7) | next(ack0) | := case | | |
| 8) | | !req0 | : 0; | - No request results no ack |
| 9) | | !req1 | : 1; | - A single request |
| 10) | | !ack0&!ack1 | :!robin; | - Simultaneous requests assertions |
| 11) | | 1 | :!ack0; | - Both requesting, toggle ack |
| 12) | esac; | | | |
| 13) | next(ack1) | := case | | |
| 14) | | !req1 | : 0; | - No request results no ack |
| 15) | | !req0 | : 1; | - A single request |
| 16) | | !ack0&ack1 | : robin; | - Simultaneous assertion |
| 17) | | 1 | : !ack1; | - Both requesting, toggle ack |
| 18) | esac; | | | |
| 19) | next(robin) :=if req0&req1&!ack0&!ack1 then !robin | | | |
| 20) | | | else robin endif; - Two simultaneous request assertions | |

From the functional specification of arbiter 40 given above, the following temporal formulas are derived that describe the properties of the device:

1. The initial state is $ack0 \wedge ack1$.
2. At all times, mutual exclusion holds, i.e., $ack0 \vee ack1$ (property $\phi1$).
3. At all times one of the following properties should hold:
   a) No requests followed by no acknowledge (property $\phi2$).
   b) A single request (when the other request is not active) is served in the following cycle (properties $\phi3$ and $\phi4$).
   c) A request active while the alternate channel is being served will be served in the following cycle (properties $\phi5$ and $\phi6$).
   d) When a cycle with no active request is followed by a cycle with two active requests, the result will be as follows—
      The first such occurrence will result in acknowledgment to channel 0 ($\phi0$).
      Each subsequent occurrence will result in acknowledgment of the channel that was not acknowledged in the previous occurrence ($\phi7$ and $\phi8$).
   The behavior of the arbiter under these conditions (no active request followed by two active requests) is governed by the non-observable variable "robin," as defined in Table I.

The above formulas correspond to the proeprties $\Phi0$, $\Phi1, \ldots, \Phi8$ listed symbolically below in Table II, which are a complete specification of arbiter 40 written in the form of a safety formula $\psi$ in Universal Computation Tree Logic (known as ACTL). ACTL is a branching-time temporal logic. It is described in detail by Grumberg et al. in "Model Checking and Modular Verification," in *ACM ransactions on Programming Language and Systems* 16(3) (1994), pp. 843–871. As the variable "robin" is not observable, it does not appear explicitly in the properties in Table II.

TABLE II $\psi = \neg ack0 \wedge \neg ack1 \wedge$
$\quad A[(\neg req0 \vee \neg req1 \vee ack0 \vee ack1)W$
$\quad\quad (req0 \wedge req1 \wedge \neg ack0 \wedge \neg ack1 \wedge AXack0)] \wedge \quad - \phi_0$
$\quad AG($
$\quad\quad (\neg ack0 \vee \neg ack1) \wedge \quad - \phi_1$
$\quad\quad (\neg req0 \wedge \neg req1 \rightarrow AX(\neg ack0 \wedge \neg ack1)) \wedge \quad - \phi_2$
$\quad\quad (req0 \wedge \neg req1 \rightarrow AX\ ack0) \wedge \quad - \phi_3$
$\quad\quad (\neg req0 \wedge req1 \rightarrow AX\ ack1) \wedge \quad - \phi_4$
$\quad\quad (req1 \wedge ack0 \rightarrow AX\ ack1) \wedge \quad - \phi_5$
$\quad\quad (req0 \wedge ack1 \rightarrow AX\ ack0) \wedge \quad - \phi_6$
$\quad\quad (req0 \wedge req1 \wedge \neg ack0 \wedge \neg ack1 \rightarrow AX(ack0 \rightarrow$
$\quad\quad\quad A[\neg req0 \vee \neg req1 \vee ack0 \vee ack1)W$
$\quad\quad\quad\quad (req0 \wedge req1 \wedge \neg ack0 \wedge \neg ack1 \wedge AXack1)])) \wedge - \phi_7$
$\quad\quad (req0 \wedge req1 \wedge \neg ack0 \wedge \neg ack1 \rightarrow AX(ack1 \rightarrow$
$\quad\quad\quad A[(z,233\ req0 \vee \neg req1 \vee ack0 \vee ack1)W$
$\quad\quad\quad\quad (req0 \wedge req1 \wedge \neg ack0 \wedge \neg ack1 \wedge AXack0)])) - \phi_8$ This representation uses the temporal operators X ("next state"), W ("weak until," i.e., remains true until), and G ("globally"), along with the quantifier A ("for all paths"). It is noted that $AG\phi \equiv A[\phi Wfalse]$.

Figure 3:
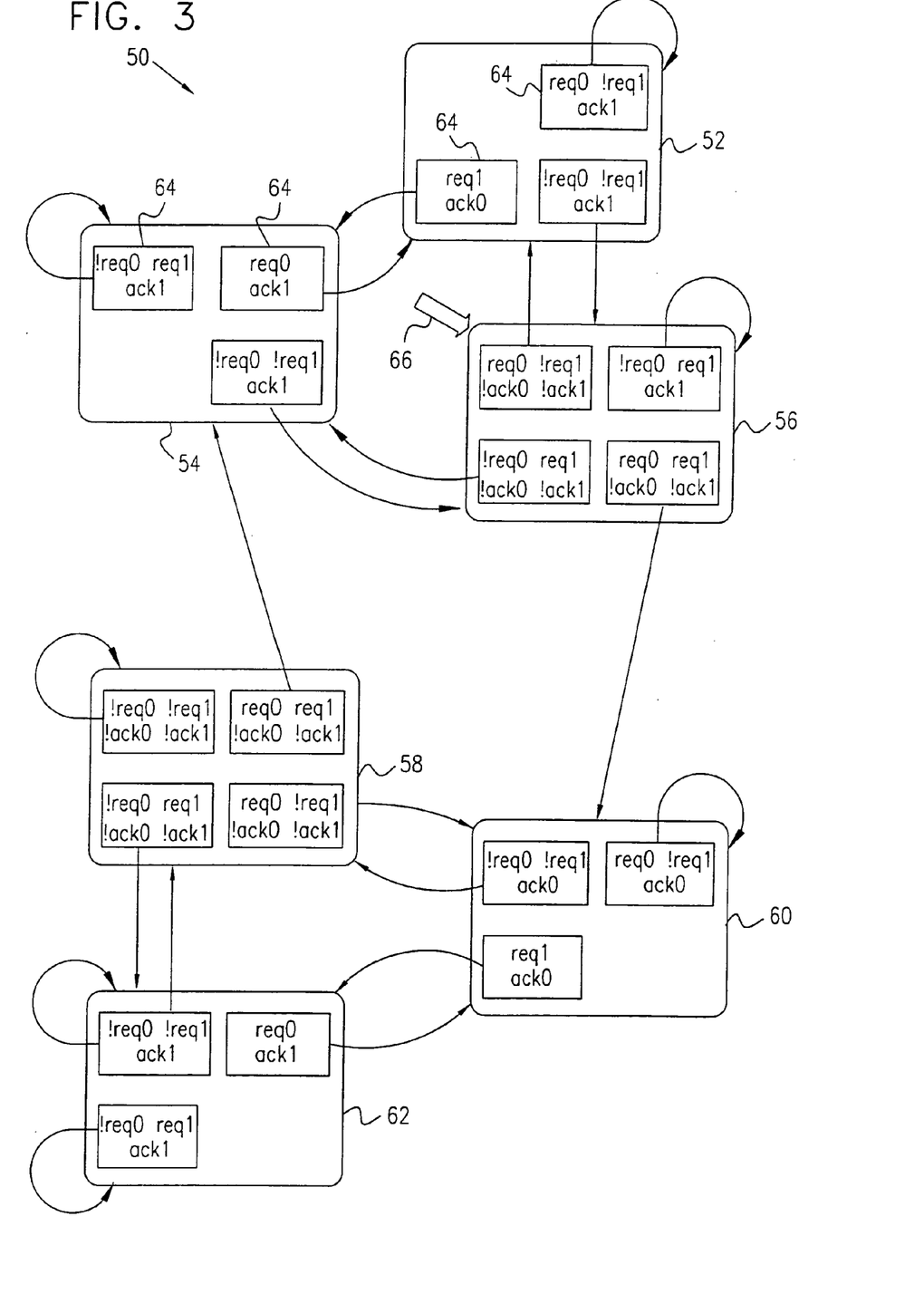
FIG. 3 is a state diagram that schematically illustrates a finite state machine corresponding to the tableau of FIG. 2, in accordance with a preferred embodiment of the present invention.

FIG. 3 is a state diagram that schematically illustrates a tableau 50, or state machine, corresponding to the properties of the safety formula in Table II, in accordance with a preferred embodiment of the present invention. The tableau is preferably a "reduced tableau," as defined in Appendix A, which is most preferably constructed automatically, using a computer program that receives the properties as its input and implements the tableau construction algorithm listed in the appendix. The tableau is used, as described further hereinbelow, to verify that the properties completely cover the states and transitions of the device model defined in Table I.

Tableau 50 comprises six state groups 52, 54, 56, 58, 60 and 62. Each of the groups includes a number of states 64 that correspond to a particular output condition of device 40, i.e., in groups 52 and 60, ack0 is asserted; in groups 54 and 62, ack1 is asserted; and in groups 56 and 58, neither output is asserted (!ack0 !ack1). In state groups 52, 54 and 56, the non-observable variable robin=0, whereas in groups 58, 60 and 62, robin=1. As indicated by an arrow 66, operation of device 40 begins in group 56, with !ack0, !ack1 and robin=0. Transitions from one state to another depend on the choice of inputs, which are marked in each state 64. Thus, for example, when req1 is asserted in state group 52, a transition is invoked to group 54, in which ack1 is asserted.

Tableau 50 is a sort of virtual device, corresponding to actual target device 40. Appendix B accordingly contains source code in VHDL representing a tableau similar to tableau 50 as a device model. In preferred embodiments of the present invention, this virtual device is tested to determine whether its states and transitions correspond exactly to those of the actual device, or equivalently whether the behavior of the virtual device under all possible combinations of input conditions is identical to that of the model of the actual device. If differences are found, they are then indicative either that the tableau (and hence the specified properties) are incomplete or that the model itself is incomplete. Methods and criteria for testing tableau 50 are described further hereinbelow.

Figure 4:
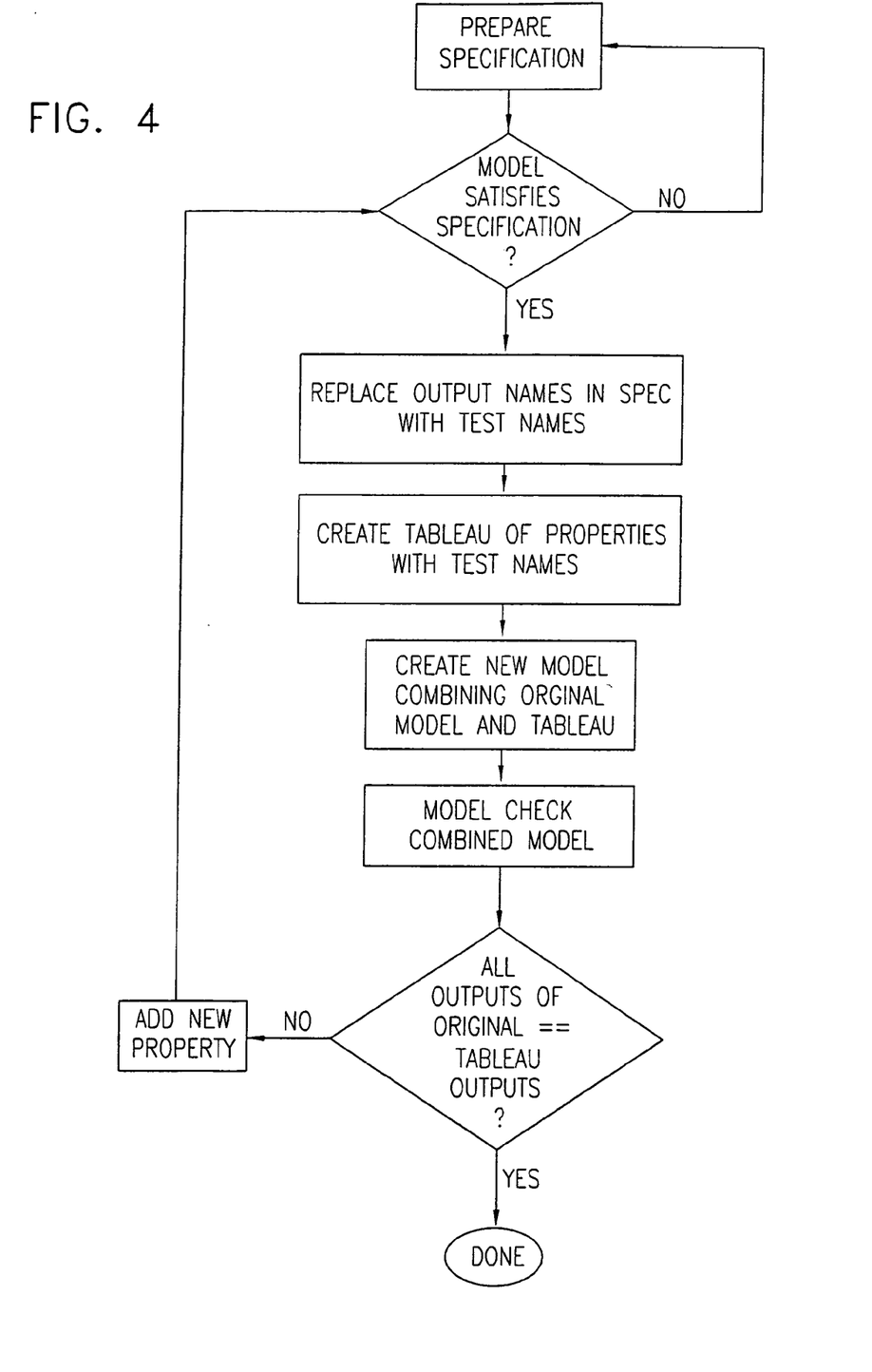
FIG. 4 is a flow chart that schematically illustrates a method for verifying a set of properties generated for the purpose of model checking, in accordance with a preferred embodiment of the present invention.

FIG. 4 is a flow chart that schematically illustrates a method for verifying a specification of model checking properties by comparing tableau 50 with device 40, in accordance with a preferred embodiment of the present invention. The method begins with preparation of the specification, such as the formula $\psi$ listed in Table II, and checking the device model M to ensure that the model satisfies the specification, i.e., that $M \models \psi$. The specification is then used to construct the tableau. As shown in FIG. 2, tableau 50 as a virtual device model has virtual inputs 72 and outputs 74, corresponding respectively to inputs 42 and outputs 44 of implementation model 40 of the target device. For the purpose of testing the tableau against the implementation model, the tableau inputs are labeled REQ0_SPEC and REQ1_SPEC, and the tableau outputs are labeled similarly, ACK0_SPEC and ACK1_SPEC.

These input and output labels are inserted in a representation of the tableau, preferably in the form of suitable program code, as listed in Appendix B. IBM RuleBase, as described hereinabove, is capable of translating the VHDL code in Appendix B into the SMV language used by model checkers. In the example shown in Appendix B, the model of device 40 is simplified, relative to the definition in Tables I and II, in that the non-observable variable "robin" is not used. Instead, ack0 always receives priority when a state in which there is no active request is followed by two active requests.

In order to test the tableau against the device model, a new model is created, combining the original implementation model and the virtual device model of the tableau. Inputs 72 of tableau 50 are tied to the corresponding inputs 42 of implementation model 40, so that the implementation model and the tableau model will receive the same input signals. The new, combined model is then input to an automatic model checking program, such as SMV. The model checker is asked to verify that the following properties regarding the combined model outputs are always true of the combined model:

ACK0==ACK0_SPEC
ACK1==ACK1_SPEC

Alternatively, in certain cases, the two outputs may be checked separately, rather than in a single pass of the model checker, using separate tableaux corresponding to subsets of the specification properties that influence the particular outputs.

If the above-mentioned properties of the combined model outputs are confirmed, tableau 50 is assured of representing a complete and correct specification of device 40. If the tableau specification is not sufficiently detailed, then the tableau outputs ACKi_SPEC will not be as constrained as the model outputs ACKi, and there will be some combination of inputs under which ACKi_SPEC will have two possible values when ACKi can have only one. This outcome will generally lead engineer 24 to conclude that an additional constraint is required, i.e., that a further property is needed in the specification. Typically, a suitable property is added and the specification is re-checked, repeating the steps described above. If now ACKi==ACKi_SPEC, then the specification can be considered complete and correct. Alternatively, it may turn out that evaluation of the model and specification in this manner will lead engineer 24 to conclude that there is an error in the implementation model, such as a missing state or transition, which causes the outputs of the model and the tableau differ. It is a further advantage of automatic model checking programs that they provide evidence of such errors, in the form of "counterexamples," that assist the engineer in identifying and correcting the error.

Figure 5:
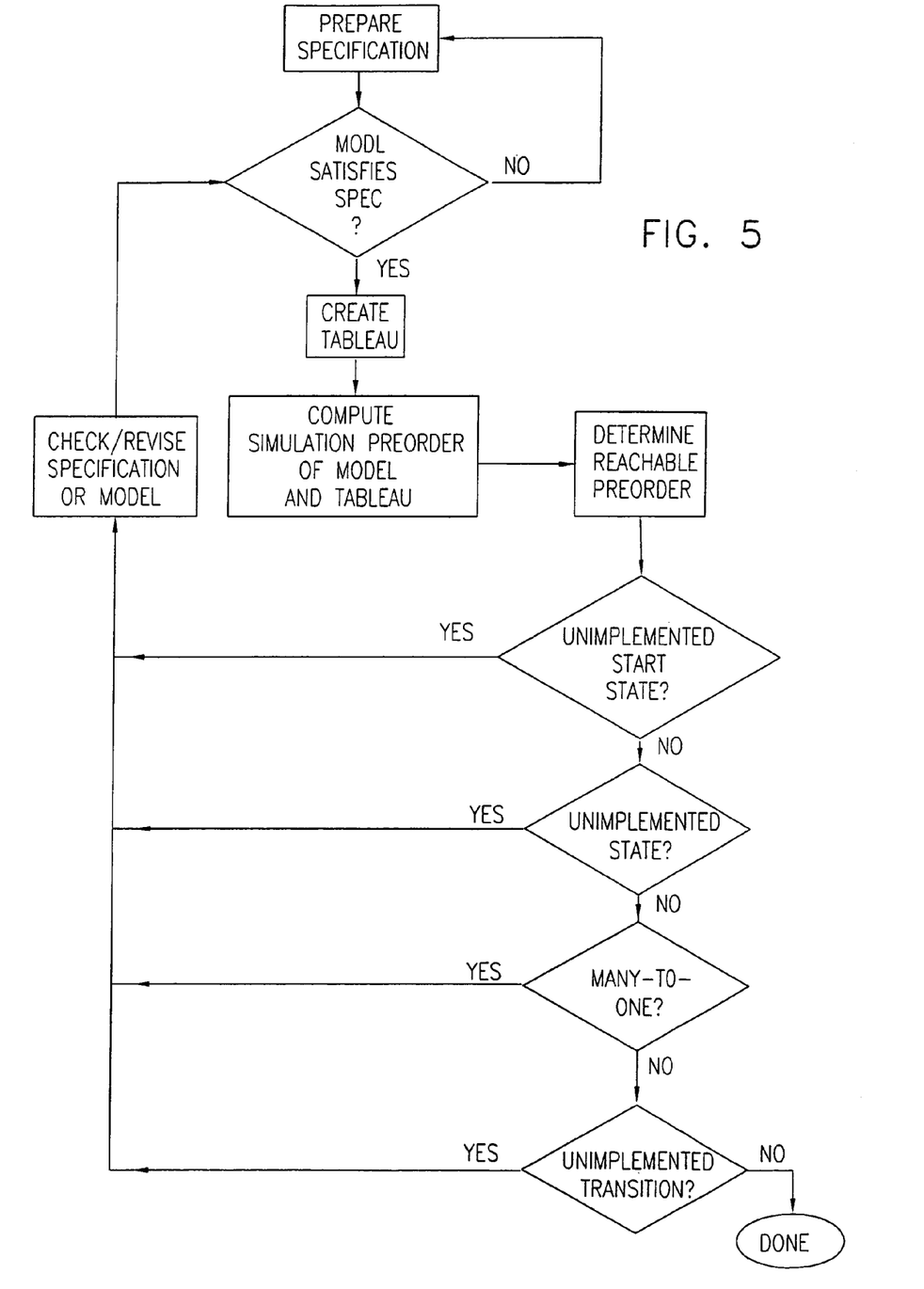
FIG. 5 is a flow chart that schematically illustrates another method for verifying a set of properties generated for the purpose of model checking, in accordance with a preferred embodiment of the present invention.

FIG. 5 is a flow chart that schematically illustrates another method for verifying a model checking specification, in accordance with a preferred embodiment of the present invention. The method begins, like the method of FIG. 4, with preparation of a specification of model properties and model checking to determine that the model satisfies the specification. The specification is then used to create a corresponding tableau, which is evaluated against the device implementation model. The method of FIG. 5 differs from the method of FIG. 4 in the manner in which the tableau is evaluated, as described hereinbelow. Whereas the method of FIG. 4 is useful primarily in checking deterministic models, the method of FIG. 5 can be used for substantially any model, including non-deterministic models.

In order to evaluate the tableau against the model, a simulation preorder, SIM, is calculated for the model and the tableau. SIM is a relation between the model M and the tableau T ($SIM \subseteq M \times T$) containing pairs of states $(s_i, s_t)$ in M and T, respectively. SIM satisfies the following requirements:

For every initial state $s_{0i}$ of M, there is an initial state $s_{0t}$ of T, such that $(s_{0i}, s_{0t})$ belongs to SIM.

For every pair of states $(s_i, s_t)$ in SIM, state $s_i$ is characterized by the same set of atomic propositions as $s_t$ (i.e., the same values of the variables ACKi and REQi in the example of device 40).

For every state-to-state transition from state $s_i$, there is a corresponding transition for state $s_t$ (although not necessarily a one-to-one correspondence).

Formally, an algorithm for the computation of SIM is presented in Table III, below, in pseudocode form. Here $S_i(s_i)$ is the set of all values of states in M, and $S_t(s_t)$ is the set of all values of states in $T(\phi)$. $R_i(s_i, s_i')$ is the transition relation of M, and $R_t(s_t, s_t')$ is the transition relation of $T(\phi)$. $L_i(s_i)$ is a labeling function that computes the values of atomic propositions, AP, of a state $s_i$ of M, while $L_t(s_t)$ is a labeling function that computes the values of atomic propositions, AP, of a state $s_t$ of $T(\phi)$.

TABLE III

Init:
$SIM_0(s_i, s_t) := \{(s_i, s_t) \in S_i \times S_t \mid L_i(s_i) = L_t(s_t)\}; j := 0$
Repeat{
$SIM_{j+1} := \{(s_i, s_t) \mid$
$\forall s_i'(R_i(s_i, s_i') \to \exists s_t'(R_t(s_t, s_t') \land SIM_j(s_i', s_t'))) \land SIM_j(s_i, s_t)$
$j := j+1$
} until $SIM_j = SIM_{j-1}$
$SIM := SIM_j$ Preferably, for efficient computation, $S_i$, $S_t$, $R_i$, $R_t$, $L_i$, $L_t$ and $SIM_j$ are all represented as Ordered Binary Decision Diagrams (OBDDs). This type of representation, using connected, directed, acyclic graphs, is known in the art of model checking. The use of OBDDs in this regard is described, for example, by McMillan in *Symbolic Model Checking* (Kluwer Academic Press, Norwell, Mass., 1993).

All of the operations shown in Table III are well known for OBDDs, except for the computation of $SIM_{j+1}$. To state this computation in OBDD terms, we define the following OBDD operations:

$compose(\vec{y}, \vec{u}) := \exists \vec{x} (a(\vec{x}, \vec{y}) \land b(\vec{x}, \vec{u}))$ $compose\_odd(\vec{y}, \vec{u}) := \exists \vec{x} (a(\vec{y}, \vec{x}) \land b(\vec{u}, \vec{x}))$ These two operations operate on two OBDDs, a and b, over three vectors of n variables, $\vec{x}$, $\vec{y}$ and $\vec{u}$. In these terms, the computation of $SIM_{j+1}$ is given by:

$SIM_{j+1}(\vec{s}_i, \vec{s}_t) := compose\_odd(R_i(\vec{s}_i, \vec{s}_i'), compose\_odd(R_t(\vec{s}_t, \vec{s}_t'), SIM_j(\vec{s}_i', \vec{s}_t'))) \land SIM_j(\vec{s}_i, \vec{s}_t)$ Based on the simulation preorder SIM, a reachable simulation preorder for M and T, ReachSIM, is determined. T may contain paths by which a state s is reached from an initial state, which do not have corresponding permissible paths in M. ReachSIM $\subseteq$ SIM contains only pairs of states $(s_i, s_t)$ characterized in that states $s_i$ and $s_t$ are reached by corresponding paths $\pi_i$ and $\pi_t$ from corresponding initial states. A path $\pi_i = s_{0i}, s_{1i}, \ldots, s_i$, and a path $\pi_t = s_{0t}, s_{1t}, \ldots, s_t$ are considered to correspond if every pair of states $(s_i, s_t)$ along the paths belongs to SIM. Details of the computation of ReachSIM are presented in Table IV:

TABLE IV

Init:
$ReachSIM_0 := (S_{0i} \times S_{0t}) \cap SIM; j := 0$
Repeat{
$ReachSIM_{j+1} := \{(s_i', s_t') \mid \exists s_i, s_t (ReachSIM_j(s_i, s_t) \land R_i(s_i, s_i') \land R_t(s_t, s_t') \land SIM(s_i', s_t'))\} \cup ReachSIM_j$
$j := j+1$
} until $ReachSIM_j = ReachSIM_{j-1}$
$ReachSIM := ReachSIM_j$ Here, too, if $S_i$, $S_t$, $R_i$, $R_t$, $L_i$, $L_t$ and $ReachSIM_j$ are all OBDDs, then all of the operations in Table IV are well known, except for the computation of $ReachSIM_{j+1}$, which is given in OBDD terms by:

$ReachSIM_{j+1}(\vec{s}_i, \vec{s}_t) := (compose(compose(ReachSIM_j(\vec{s}_i, \vec{s}_t), R_i(\vec{s}_i, \vec{s}_i')), R_t(\vec{s}_t, \vec{s}_t')) \land SIM(\vec{s}_i', \vec{s}_t')) \lor ReachSIM_j(\vec{s}_i', \vec{s}_t')$ ReachSIM thus identifies a set of states in T having transitions that correspond to the actual transitions in M. There may yet be, however, states or transitions in T that do not have corresponding states or transitions in M, meaning that the specification does not constrain the implementation model tightly enough, so that one or more additional properties are needed. Such states and transitions are referred to herein as being "unimplemented." There may likewise be states in T that correspond simultaneously to two or more states in M. Such discrepancies are detected using ReachSIM to evaluate the following criteria (preferably using OBDD operations), either serially or in parallel:

Unimplemented start states:

$\{s_t \in S_{0t} \mid \forall s_i \in S_{0i}[(s_i, s_t) \notin ReachSIM]\}$

These are initial tableau states that have no corresponding initial states in the model (and therefore are absent from ReachSIM). The existence of an unimplemented start state indicates either that the specification does not adequately constrain the start states, or that the model is lacking a required initial state.

Unimplemented states:

$\{s_t \in S_t \mid \forall s_i \in S_i[(s_i, s_t) \notin ReachSIM]\}$

The existence of a state anywhere in the tableau that is not included in ReachSIM indicates either that the specification is lacking in constraints or that a meaningful state of the device is not implemented in the model.

Unimplemented transitions:

$(s_t, s_t') \in R_t, \exists s_i, s_i' \in S_i,$ $(s_i, s_t) \in ReachSIM, (s_i', s_t') \in ReachSIM, (s_i, s_i') \notin R_i\}$ These are transitions between states of the tableau for which there is no corresponding transition in the model. The states belong to ReachSIM, so that they have corresponding states in the model, which are reached by corresponding paths. The existence of an unimplemented transition indicates either that the specification is not tight enough or that a required transition, between reachable implementation states, was not implemented in the model. Assuming $S_i$, $R_i$, $R_t$ and ReachSIM are all OBDDs, the set of unimplemented transitions can be represented by the following equation:

$$\text{nimplementedTransition}(\vec{s}_i, \vec{s}_i') := \text{compose}(\text{compose}(\bigwedge R_i(\vec{s}_i, \vec{s}_i'), \text{ReachSIM}(\vec{s}_i, \vec{s}_i)), \text{ReachSIM}(\vec{s}_i', \vec{s}_i')) \bigwedge R_t(\vec{s}_i, \vec{s}_i')$$

Many-to-one mapping:

$$s_t \in S_t | \exists s_{1i}, s_{2i} \in S_i(s_{1i}, s_t) \in \text{ReachSIM}, (s_{2i}, s_t) \in \text{ReachSIM}, s_{1i} \neq s_{2i}]$$

In this case, there may be a tableau state to which multiple implementation states are mapped, i.e., a state s which is paired in ReachSIM with at least two different model states $s_i'$ and $s_j'$. The existence of a many-to-one state indicates either that the specification is not sufficiently detailed, or that the implementation contains redundancies. If ReachSIM and the model states are OBDDs, the set of many-to-one states can be represented by:

$$\text{ManyToOne}(\vec{s}_t) = \exists v_1(\text{ReachSIM}(\vec{s}_1, \vec{s}_t) \bigwedge \text{compose}((\vec{s}_1 \neq \vec{s}_2) \text{ReachSIM}(\vec{s}_2, \vec{s}_t)))$$

If the first three of these four criteria return empty results, then T is a complete specification of M. Any dissimilarity between the tableau and the implementation will result in a non-empty result. Preferably, the tableau T that is used in this method is a reduced tableau, as defined in Appendix A, since traditional (non-reduced) tableaux typically contain redundancies, which are removed in the reduced tableau. If the first three of the criteria above hold (i.e., return empty results), T and M are bisimilar, and the fourth criterion is not necessary to establish the completeness of T. It may, however, indicate that there are redundancies in the implementation.

As noted hereinabove, verification of specification properties vis-a-vis the implementation model, using any of the methods described herein, is preferably carried out using software for this purpose running on processor 22. Software for use in such verification is preferably supplied as component of a simulation and model checking software package. Alternatively, the software for tableau construction and verification is provided as an independent software package. In either case, the software may be conveyed to processor 22 in intangible form, over a network, for example, or on tangible media, such as CD-ROM.

Although preferred embodiments are described hereinabove with reference to certain methods and languages used in model checking, it will be understood that the application of the present invention is not limited to any particular language or method of implementation. Those skilled in the art will appreciate that the principles of the present invention may similarly be used in other areas of verification, not only for electronic devices, but also in verification of other types of target systems, as well, for example, transportation systems or complex valve manifolds. It will thus be understood that the preferred embodiments described above are cited by way of example, and the full scope of the invention is limited only by the claims.

APPENDIX A

1 Reduced Tableau for ACTL

In this section we define a reduced tableau for the subset of ACTL safety formulas. We follow the definition of the reduced tableau for LTL presented in [3]. A tableau is a special form of a Kripke structure, consisting of states labeled with atomic propositions and transitions between the states. As is often the case with tableaux for temporal logics (e.g. [2, 1]), a state of the tableau consists of a set of formulas that are supposed to hold along all paths leaving the state. Unlike typical tableaux, however, the formulas in the states of the reduced tableau are interpreted over a three-valued domain. Thus, a state may include a formula or its negation, or none of the two. If the latter occurs, it reflects a "don't care" situation, i.e. the formula may be either true or false in the state.

Similarly to [2], we wish the reduced tableau for a formula $\psi$ to satisfy $\phi$. Furthermore, it should be greater by the simulation preorder [4] than any Kripke structure that satisfies $\psi$. In order to achieve these goals we will adapt both definitions of $\models$ and simulation preorder to be applicable to three-valued structures. Below we present the formal definitions of the tableau and of the adapted relations.

Let $AP_\psi$ be the set of atomic propositions in an ACTL formula $\psi$.

Definition 1.1 (sub-formulas) The set of sub-formulas of $\psi$ is defined recursively as follows:
1. $\text{sub}(p)=\{p\}$ and $\text{sub}(\overline{p})=\{\overline{p}\}$, if $p \in AP_\psi$
2. $\text{sub}(\phi)=\{\phi\} \cup \text{sub}(g_1) \cup \text{sub}(g_2)$, if $\phi=g_1 \wedge g_2$ or $\phi=g_1 \vee g_2$.
3. $\text{sub}(AX\ g_1)=\{AX\ g_1\} \cup \text{sub}(g_1)$
4. $\text{sub}(A[g_1\ W\ g_2])=\{A[g_1\ W\ g_2], AX\ A[g_1\ W\ g_2]\} \cup \text{sub}(g_1) \cup \text{sub}(g_2)$ We will distinguish between α-formulas and β-formulas, which are conjunctions and disjunctions, respectively. In the reduced tableau, if a state satisfies a conjunction, then it also satisfies its two conjuncts. On the other hand, if it satisfies a disjunction, it will usually satisfy only one of the disjunct, leaving the other as "don't care".

Definition 1.2 (α-formula)

A formula $g \in \text{sub}(\psi)$ is an α-formula if $g=g_1 \wedge g_2$.

Definition 1.3 (β-formula)

A formula $g \in \text{sub}(\psi)$ is a β-formula if:
1. $g=g_1 \vee g_2$; in which case $k_1(g)=\{g_1\}$ and $k_2(g)=\{g_2\}$.
2. $g=A[g_1\ W\ g_2]$, in which case $k_1(g)=\{g_2\}$ and $k_2(g)=\{g_1, AX\ A[g_1\ W\ g_2]\}$.

Definition 1.4 (A particle) A set of formulas P is a particle if:
1. $P \subseteq \text{sub}(\psi)$
2. $p \in P \rightarrow \overline{p} \notin P$
3. $\overline{p} \in P \rightarrow p \notin P$
4. P does not contain any α-formula nor any β-formula.

Definition 1.5 (Implied successor) A formula g is an implied successor of a particle P if AX $g \in P$. We denote by imps(P) the set of implied successors of P; i.e., imps(P)=$\{g|AX\ g \in P\}$ Note that if P does not include any formula of the form AX g then imps(P)={ }. The particle { } means that the state reached has no commitments to satisfy any of the formulas. Thus, it may be the start of any possible paths. Furthermore, it may simulate any state. We later see that the only son of particle { } is the particle { } itself.

function Remove_Redandant(S: Set of Particles): returns Set of Particles return the largest set such that $\{P \in S | \forall P_i \in S_i P_i \not\subset P\}$ recursive function $cover_p$(B: Set of formulas) returns: Set of particles
   if B is not locally consistent then return { } —no particles contain B
   if there exists some α-formula $r=r_1 \wedge r_2$ in B
   then return $cover_p(B-\{r\} \cup \{r_1,r_2\})$
   if there exists some β-formula r such that r∈B then return $cover_p(B-\{r\} \cup k_1(r)) \cup cover_p(B-\{r\} \cup k_2(r))$
   return {B} –B is a particle end function Definition 1.6 ($Successors_p(P)$)

$Successors_p(P)$=Remove_Redandant($cover_p(imps(P))$).

We now describe an iterative algorithm PART_TAB that produces the tableau structure.
   Algorithm: PART_TAB

```
S_τ0 := Remove_Redandant(cover_p({ψ}))
S_τ := S_τ0
R_τ := ∅
Mark all particles in S_τ as unprocessed
For each unprocessed particle P in S_τ do
    S := successors_p(P);
    For each Q ∈ S
        Add (P,Q) to R_τ;
        Define L(P) = P ∩ {p|p ∈ AP_ψ} ∩ ¬p|p ∈ AP_ψ}
        If Q ∉ S_τ;
            Add Q to S_τ;
            Mark Q as unprocessed;
        end for
        Mark P as processed;
    end for
end for
```

Note that a state is labeled by propositions from AP and by their negations. Since a state is a particle, it will never contain both a proposition and its negation, but it may contain none of them.

We now prune the structure we received, such that any particle has at least one successor.
   Algorithm: PRUNE_TAB

```
Mark all particles in S_τ as unprocessed
Repeat until all particles in S_τ are processed
    For each unprocessed particle P in S_τ do
        If P has no successors
            Remove P from S_τ
            Remove any edge going to P from R_τ
            Mark the remaining particles in S_τ as unprocessed
            Skip
        Mark P as processed;
    end for
end Repeat
```

After activating PART_TAB and PRUNE_TAB we have produced the tableau $\tau(\psi)=<S_\tau, S_{\tau 0}, R_\tau, L_\tau>$ for ψ.

Note that the tableau we construct is total. Any particle that has no successors is removed.

REFERENCES

[1] E. M. Clarke, O. Grumberg, H. Hiraishi, S. Jha, D. L. Long, K. L. McMillan, and L. A. Ness. Verification of the Futurebus+ Cache Coherence Protocol. In *Proceedings of the 11th International Conference on Computer Hardware Description Languages*, pages 15–30, 1993.

[2] O. Grumberg and D. E. Long. Model checking and modular verification. *ACM Trans. on Programming Languages and Systems*, 16(3):843–871, 1994.

[3] Z. Manna and A. Pnueli. *Temporal verifications of Reactive Systems—Safety*. Springer-Verlag, 1995.

[4] R. Milner. An algebraic definition of simulation between programs. In *In proceedings of the 2nd International Joint Conference on Artificial Intelligence*, pages 481–489, September 1971.

APPENDIX B

The following is a program listing in VHDL describing a tableau that corresponds generally to the properties of arbiter 40 listed in Table II. As noted hereinabove, however, the listing below is based on a simplified model without the non-observable variable "robin." In place of the output names ACK0_SPEC and ACK1_SPEC shown in FIG. 2, the names ack0_new and ack1_new are used in the listing; and req0 and req1 in the listing correspond respectively to REQ0_SPEC and REQ1_SPEC.

```
library ieee;
use ieee.std_logic_1164.all;
entity full_spec is
    port (
        rb_clock  : in std_ulogic;
        ack0_new  : in std_ulogic;
        ack1_new  : in std_ulogic;
        req0      : in std_ulogic;
        req1      : in std_ulogic;
        reset     : in std_ulogic;
        fails     : out
                    std_ulogic_vector(0 to 5)
    );
end full_spec;
architecture rb of full_spec is
    signal not_rb_reset: std_ulogic ;
    signal rb_reset  : std_ulogic ;
    type rb_enum_type is (iu_enum_slash_err,
            iu_enum_slash_z);
begin
    p:
    process
    begin
        wait until rb_clock'event and rb_clock='1';
        not_rb_reset <= '1';
    end process;
    rb_reset <= reset or (not not_rb_reset);
    f1:
        fails(0) <= not b21(((((not ack0_new) or (not
                        ack1_new))) /= '0')
            or (rb_reset /= '0') or (rb_clock /= '1'));
    f2:
    block
        constant n: integer := 4;
        signal v: std_ulogic_vector(0 to n-1) :=
            "1110"
        signal v_out: std_ulogic_vector(0 to n-1);
        signal vnext: std_ulogic_vector(0 to n-1);
        signal ok: std_ulogic := '1';
    begin
        v_out(0) <= '0';
        v_out(1) <= v(1) and ('1');
        v_out(2) <= v(2) and (((not req0) and (not
                        req1)));
        v_out(3) <= v(3) and ((not ((not ack0_new) and
                        (not ack1_new))));
        vnext(0) <= '0';
```

-continued

```
      vnext(1) <= v_out(1);
      vnext(2) <= v_out(1);
      vnext(3) <= v_out(2);
   p:
   process
begin
   wait until rb_clock'event and rb_clock='1';
         if rb_reset = '1' then
               v <= "1110";
               ok <= '1';
         else
            if (not (v(3) and (not ((not ack0_new)
                  and (not ack1_new))
          ))) = '0' then
                  ok <= '0';
            elsif ok = '0' then
                  ok <= '1';
            end if;
            v <= vnext;
         end if;
end process;
      fails(1) <= not b21 ((ok /= '0') or (rb_reset
                  /= '0')
   or (rb_clock /='1'));
end block;
f3:
block
      constant n: integer := 4;
      signal v: std_ulogic_vector(0 to n-1) :=
            "1110";
      signal v_out: std_ulogic_vector(0 to n-1);
      signal vnext: std_ulogic_vector(0 to n-1);
      signal ok: std_ulogic := '1';
begin
   v_out(0) <= '0';
   v_out(1) <= v(1) and ('1');
   v_out(2) <= v(2) and ((req0 and (not ack0_new)));
   v_out(3) <= v(3) and ((not ack0_new));
   vnext(0) <= '0';
   vnext(1) <= v_out(1);
   vnext(2) <= v_out(1);
   vnext(3) <= v_out(2);
   p:
   process
begin
   wait until rb_clock'event and rb_clock='1';
         if rb_reset = '1' then
               v <= "1110";
               ok <= '1';
         else
            if (not (v(3) and (not ack0_new))) =
                  '0' then
                  ok <= '0';
            elsif ok = '0' then
                  ok <= '1';
            end if;
            v <= vnext;
         end if;
end process;
      fails(2) <= not b21 ((ok /= '0') or (rb_reset
                  /= '0')
   or (rb_clock /= '1'));
end block;
f4:
block
      constant n: integer := 4;
      signal v: std_ulogic_vector(0 to n-1) :=
            "1110";
      signal v_out: std_ulogic_vector(0 to n-1);
      signal vnext: std_ulogic_vector(0 to n-1);
      signal ok: std_ulogic := '1';
begin
   v_out(0) <= '0';
   v_out(1) <= v(1) and ('1');
   v_out(2) <= v(2) and (((not req0) and req1));
   v_out(3) <= v(3) and ((not ack1_new));
   vnext(0) <= '0';
```

-continued

```
      vnext(1) <= v_out(1);
      vnext(2) <= v_out(1);
      vnext(3) <= v_out(2);
   p:
   process
begin
   wait until rb_clock'event and rb_clock='1';
         if rb_reset = '1' then
               v <= "1110";
               ok <= '1';
         else
            if (not (v(3) and (not ack1_new))) =
                  '0' then
                  ok <= '0';
            elsif ok = '0' then
                  ok <= '1';
            end if;
            v <= vnext;
         end if;
end process;
      fails(3) <= not b21 ((ok /= '0') or (rb_reset
                  /= '0')
   or (rb_clock /= '1'));
end block;
f5:
block
      constant n: integer := 4;
      signal v: std_ulogic_vector(0 to n-1) :=
            "1110";
      signal v_out: std_ulogic_vector(0 to n-1);
      signal vnext: std_ulogic_vector(0 to n-1);
      signal ok: std_ulogic := '1';
begin
   v_out(0) <= '0';
   v_out(1) <= v(1) and ('1');
   v_out(2) <= v(2) and ((req1 and ack0_new));
   v_out(3) <= v(3) and ((not ack1_new));
   vnext(0) <= '0';
   vnext(1) <= v_out(1);
   vnext(2) <= v_out(1);
   vnext(3) <= v_out(2);
   p:
   process
begin
   wait until rb_clock'event and rb_clock='1';
         if rb_reset = '1' then
               v <= "1110";
               ok <= '1';
         else
            if (not (v(3) and (not ack1_new))) =
                  '0' then
                  ok <= '0';
            elsif ok = '0' then
                  ok <= '1';
            end if;
            v <= vnext;
         end if;
end process;
      fails(4) <= not b21 ((ok /= '0') or (rb_reset
                  /= '0')
   or (rb_clock /= '1'));
end block;
f6:
block
      constant n: integer := 4;
      signal v: std_ulogic_vector(0 to n-1) :=
            "1110";
      signal v_out: std_ulogic_vector(0 to n-1);
      signal vnext: std_ulogic_vector(0 to n-1);
      signal ok: std_ulogic := '1';
begin
   v_out(0) <= '0';
   v_out(1) <= v(1) and ('1');
   v_out(2) <= v(2) and ((req0 and (not req1)));
   v_out(3) <= v(3) and ((not ack0_new));
   vnext(0) <= '0';
```

```
-continued
        vnext(1) <= v_out(1);
        vnext(2) <= v_out(1);
        vnext(3) <= v_out(2);
        p:
        process
    begin
        wait until rb_clock'event and rb_clock='1';
            if rb_reset = '1' then
                v <= "1110";
                ok <= '1';
            else
                if (not (v(3) and (not ack0_new))) =
                                '0' then
                    ok <= '0';
                elsif ok = '0' then
                    ok <= '1';
                end if;
                v <= vnext;
            end if;
        end process;
            fails(5) <= not b21 ((ok /= '0') or (rb_reset
                            /= '0')
            or (rb_clock /= '1'));
        end block;
    end rb;
```

The invention claimed is:

1. A method for verification, comprising:
providing an implementation model, which defines model states of a target system and model transitions between the model states;
providing a specification of the target system, comprising properties that the system is expected to obey;
creating a tableau from the specification, the tableau defining tableau states with tableau transitions between the tableau states in accordance with the properties; and
comparing the tableau transitions to the model transitions to determine whether a discrepancy exists therebetween.

2. A method according to claim 1, wherein creating the tableau comprises defining a finite state machine using a hardware description language.

3. A method according to claim 2, wherein the implementation model has model inputs and outputs, and wherein defining the finite state machine comprises describing a virtual device having inputs and outputs corresponding to the model inputs and outputs of the implementation model.

4. A method according to claim 3, wherein comparing the transitions comprises performing a reachability analysis using both the implementation model and the tableau while providing identical inputs to the inputs of both the implementation model and the tableau, and verifying that the outputs are always identical.

5. A method according to claim 4, wherein performing the reachability analysis comprises comparing the model and the tableau automatically using a model checker.

6. A method according to claim 4, wherein performing the reachability analysis comprises providing evidence of a tableau transition that is not implemented in the model.

7. A method according to claim 1, wherein comparing the tableau transitions comprises associating model transitions with corresponding tableau transitions.

8. A method according to claim 7, wherein associating the transitions comprises defining a reachable simulation pre-order relating the model and the tableau.

9. A method according to claim 7, wherein associating the transitions comprises finding a tableau transition that is not implemented in the model.

10. A method according to claim 9, wherein finding the tableau transition that is not implemented in the model comprises deriving an indication, based on the unimplemented transition, that the specification is not complete with respect to the model.

11. A method according to claim 9, wherein finding the tableau transition that is not implemented in the model comprises deriving an indication, based on the unimplemented transition, that a transition of the target system is missing in the model.

12. A method according to claim 1, and comprising associating model states with corresponding tableau states.

13. A method according to claim 12, wherein associating the model states with the corresponding tableau states comprises finding a tableau state that is not implemented in the model.

14. A method according to claim 13, wherein finding the tableau state that is not implemented in the model comprises deriving an indication, based on the unimplemented state, that the specification is not complete with respect to the model.

15. A method according to claim 13, wherein finding the tableau state that is not implemented in the model comprises deriving an indication, based on the unimplemented state, that a state of the target system is missing in the model.

16. A method according to claim 12, wherein associating the model states with the corresponding tableau states comprises finding multiple model states corresponding to a single tableau state.

17. A method according to claim 1, wherein creating the tableau comprises creating a reduced tableau from which one or more redundant states have been eliminated.

18. A method according to claim 1, wherein comparing the transitions comprises verifying that the specification is a complete and correct description of the implementation model responsive to the comparison.

19. A verification processor, which is configured to receive an implementation model, defining model states of a target system and model transitions between the model states, and to receive a specification of the target system, including properties that the system is expected to obey, and which is operative to create a tableau from the specification, the tableau defining tableau states with tableau transitions between the tableau states in accordance with the properties, and to compare the tableau transitions to the model transitions to determine whether a discrepancy exists therebetween.

20. A processor according to claim 19, which is operative to perform model checking of the implementation model.

21. A computer software product for verification of a specification of a target system, which specification includes properties that the system is expected to obey, by comparison with an implementation model, which defines model states of the target system and model transitions between the model states, the product comprising a computer-readable medium having computer program instructions recorded therein, which instructions, when read by a computer, cause the computer to create a tableau from the specification, the tableau defining tableau states with tableau transitions between the tableau states in accordance with the properties, and to compare the tableau transitions to the model transitions to determine whether a discrepancy exists therebetween.

22. A product according to claim 21, wherein the program instructions cause the computer to compare the tableau with the model by running a reachability analysis using both the implementation model and the tableau while providing identical inputs to the inputs of both the implementation model and the tableau, and verifying that the outputs are always identical.

23. A product according to claim 22, wherein the reachability analysis is performed using an automatic model checker.

24. A product according to claim 21, wherein the instructions cause the computer to verify that the specification is a complete description of the implementation model.

25. A method for verification, comprising:
providing an implementation model, which defines model states of a target system and model transitions between the model states;
providing a specification of the target system, comprising properties that the system is expected to obey;
creating a tableau from the specification, the tableau defining tableau states with tableau transitions between the tableau states in accordance with the properties; and
comparing the model and the tableau by inputting the model and the tableau to an automatic model checking program.

26. A method according to claim 25, wherein creating the tableau comprises defining a finite state machine using a hardware description language.

27. A method according to claim 26, wherein the input model has model inputs and outputs, and wherein defining the finite state machine comprises describing a virtual device having inputs and outputs corresponding to the model inputs and outputs of the implementation model.

28. A method according to claim 27, wherein comparing the model and the tableau comprises running the model checker while providing identical inputs to the inputs of both the implementation model and the tableau, and verifying that the outputs are always identical.

29. A method according to claim 25, wherein comparing the model and the tableau comprises providing evidence of a transition or state in the tableau that is not implemented in the model.

30. A method according to claim 29, wherein providing the evidence comprises providing a counter-example indicative of the unimplemented transition or state.

31. Model checking apparatus, which is configured to receive an implementation model, defining model states of a target system and model transitions between the model states, and to receive a specification of the target system, including properties that the system is expected to obey, and which is operative to create a tableau from the specification, the tableau defining tableau states with tableau transitions between the tableau states in accordance with the properties, and to compare the tableau to the model by inputting the model and the tableau to an automatic model checking program.

32. A computer software product for verification of a specification of a target system, which specification includes properties that the system is expected to obey, by comparison with an implementation model, which defines model states of the target system and model transitions between the model states, the product comprising a computer-readable medium having computer program instructions recorded therein, which instructions, when read by a computer, cause the computer to create a tableau from the specification, the tableau defining tableau states with tableau transitions between the tableau states in accordance with the properties, and to compare the tableau to the model by inputting the model and the tableau to an automatic model checking program.

* * * * *

UNITED STATES PATENT AND TRADEMARK OFFICE
CERTIFICATE OF CORRECTION

PATENT NO. : 7,120,568 B1
APPLICATION NO. : 09/605334
DATED : October 10, 2006
INVENTOR(S) : Daniel Geist et al.

It is certified that error appears in the above-identified patent and that said Letters Patent is hereby corrected as shown below:

On title page an Assignee was omitted:

Item [73] please insert -- International Business Machines Corporation, Armonk (NY) --.

Signed and Sealed this

Seventeenth Day of April, 2007

JON W. DUDAS
*Director of the United States Patent and Trademark Office*